US008728287B2

(12) United States Patent
Martin et al.

(10) Patent No.: US 8,728,287 B2
(45) Date of Patent: May 20, 2014

(54) OXYNITRIDE SPUTTERING TARGET

(75) Inventors: Michel Martin, Septeme (FR); Philippe Maurin-Perrier, St Marcellin en Forez (FR); Olivier Blandenet, Meylan (FR)

(73) Assignee: H.E.F., Andrezieux Boutheon (FR)

( * ) Notice: Subject to any disclaimer, the term of this patent is extended or adjusted under 35 U.S.C. 154(b) by 990 days.

(21) Appl. No.: 12/593,993

(22) PCT Filed: Mar. 26, 2008

(86) PCT No.: PCT/FR2008/050520
§ 371 (c)(1),
(2), (4) Date: Sep. 30, 2009

(87) PCT Pub. No.: WO2008/132409
PCT Pub. Date: Nov. 6, 2008

(65) Prior Publication Data
US 2010/0129722 A1 May 27, 2010

(30) Foreign Application Priority Data
Apr. 6, 2007 (FR) ..................... 07 54340

(51) Int. Cl.
| | | |
|---|---|---|
| C25B 9/00 | (2006.01) | |
| C23C 14/00 | (2006.01) | |
| C25B 11/00 | (2006.01) | |
| C25B 13/00 | (2006.01) | |
| C04B 35/26 | (2006.01) | |
| C04B 35/64 | (2006.01) | |
| H01F 1/00 | (2006.01) | |
| H01J 7/18 | (2006.01) | |
| H01J 35/20 | (2006.01) | |
| H01K 1/56 | (2006.01) | |
| H01B 1/06 | (2006.01) | |
| H01B 1/24 | (2006.01) | |
| H01J 37/34 | (2006.01) | |
| C23C 14/06 | (2006.01) | |
| C23C 14/08 | (2006.01) | |
| H01M 6/18 | (2006.01) | |
| H01M 6/40 | (2006.01) | |
| H01M 10/0562 | (2010.01) | |
| H01M 2/14 | (2006.01) | |
| H01M 10/058 | (2010.01) | |

(52) U.S. Cl.
CPC ......... *H01J 37/3426* (2013.01); *H01J 37/3414* (2013.01); *H01J 37/3411* (2013.01); *C23C 14/0641* (2013.01); *C23C 14/0676* (2013.01); *C23C 14/08* (2013.01); *H01M 2/145* (2013.01); *H01M 6/18* (2013.01); *H01M 6/40* (2013.01); *H01M 10/0562* (2013.01); *H01M 10/058* (2013.01); *H01M 2300/0068* (2013.01); *H01M 2300/0071* (2013.01); *Y02E 60/12* (2013.01); *Y02E 60/122* (2013.01)

USPC .............. 204/298.13; 204/298.12; 252/62.61; 252/181.4; 252/181.7; 252/509

(58) Field of Classification Search
CPC .............. H01J 37/3411; H01J 37/3414; H01J 37/3426; C23C 14/0641; C23C 14/0676; C23C 14/08; H01M 2/145; H01M 6/18; H01M 6/40; H01M 10/0562; H01M 10/058; H01M 2300/0068; H01M 2300/0071; Y02E 60/12; Y02E 60/122
USPC .......... 204/298.12, 298.13; 252/62.61, 181.4, 252/181.7, 509
See application file for complete search history.

(56) References Cited

U.S. PATENT DOCUMENTS

| | | |
|---|---|---|
| 6,818,356 B1 | 11/2004 | Bates |
| 8,197,781 B2 * | 6/2012 | Neudecker et al. ........... 423/312 |
| 2004/0023106 A1 | 2/2004 | Benson et al. |
| 2007/0076286 A1 | 4/2007 | Sung et al. |

FOREIGN PATENT DOCUMENTS

| | | |
|---|---|---|
| FR | 2862432 A | 5/2005 |
| IL | 175505 B | 11/2010 |

OTHER PUBLICATIONS

Roh, N., Lee, S., Kwon, H. Effects of Deposition Condition on the Ionic Conductivity and Structure of Amorphous Lithium Phosphosphorus Oxynitride Thin Film, Korea, 1999. p. 43-49 [online] [Accessed on Jun. 21, 2012].*
Machine Translation—FR 2862432.*
Sung Jong Yoo et al: "Enhanced reliability of electrochromic devices with a LiPON protective layer" Journal of the Electrochemical Society Electrochem. Soc. USA, vol. 154, No. 2, Feb. 2007, pp. P6-P10, XP002461597 ISSN: 0013-4651 p. P6, right-hand column, paragraph 2.
Ron N-S et al: "Effects of deposition condition on the ionic conductivity and structure of amorphous lithium phosphorus oxynitrate thin film" Scripta Materialia, Elsevier, Amsterdam, NL, vol. 42, No. 1, Dec, 17, 1999, pp. 43-49, XP004325885, ISSN: 1359-6462.
International Search Report for PCT/FR2008/050520, mailed Sep. 17, 2009.

* cited by examiner

*Primary Examiner* — Michael Band
(74) *Attorney, Agent, or Firm* — Heslin Rothenberg Farley & Mesiti P.C.

(57) ABSTRACT

A cathode sputtering target includes: between 30 and 40 atomic % of a metal, between 2 and 10 atomic % of nitrogen, and between 35 and 50 atomic % of oxygen. The remainder up to 100% is constituted by at least one element selected from the group that comprises phosphorous (P), boron (B), silicon (Si), germanium (Ge), gallium (Ga), sulphur (S) and aluminium (Al). Also provides a method of manufacturing a thin film from the target, and an electrochemical device comprising the thin film.

1 Claim, No Drawings

OXYNITRIDE SPUTTERING TARGET

CROSS REFERENCE TO RELATED APPLICATIONS

This application is a national stage filing under section 371 of International Application No. PCT/FR2008/050520 filed on Mar. 26, 2008, and published in French on Nov. 6, 2008 as WO 2008/132409 and claims priority of French application No. 0754340 filed on Apr. 6, 2007, the entire disclosure of these applications being hereby incorporated herein by reference.

FIELD OF THE INVENTION

The object of the invention is a lithium oxynitride ion sputtering target. It also relates to a method for making an electrolyte in the form of a lithium oxynitride thin film from said target. It relates lastly to an electrochemical device comprising a substrate provided with said electrolyte.

PRIOR ART

Electrochemical devices such as all-solid micro-batteries, electrochromic devices or micro or super capacitors comprise an electrolyte membrane that comes in the form of a thin mineral film between 1 and 2μ thick, the film being vacuum deposited by cathode sputtering from a target.

Currently used targets are of the oxide type such as for example lithium phosphate ($Li_3PO_4$), lithium silicate ($SiO_4$) lithium borate ($LiBO_2$), lithium sulphate ($Li_2SO_4$) and are generally sputtered in pure nitrogen thereby improving the electrochemical performance.

Nonetheless, apart from the good electrochemical performance obtained, problems have to be faced, if said methods are to be industrialized, in terms of the deposition rate, conductivity and mechanical properties of the thin films.

To take the deposition rate first, this is at best generally about 1 μm per hour. In particular, the document U.S. Pat. No. 5,338,625 describes a method for manufacturing LiPON thin films by RF magnetron cathode sputtering using a $Li_3PO_4$ target in nitrogen. Deposition rates are obtained of between 0.8 and 1 nm per minute, which is still incompatible with any potential industrialization.

The possibility is known from the document U.S. Pat. No. 4,428,811 of obtaining high deposition rates in excess of 100 μm per minute, but of metal nitride such as titanium, zirconium and hafnium nitride deposited by reactive cathode sputtering of titanium, zirconium and hafnium targets respectively in an argon/nitrogen mixture. In said document the thin films obtained are not oxynitrides but nitrides, but they are however depositions produced in reactive mode in nitrogen by magnetron cathode sputtering which illustrate the possibility of obtaining high deposition rates via this technique.

The document Scripta materials 42 (2000) 43-49 describes the implementation of a $Li_3PO_4+Li_3N$ molar composition target to obtain a thin film of lithium oxynitride. In practice, the target is sputtered in nitrogen at high power densities of between 2 and 5 watts per $cm^2$. Under these conditions, the deposition rate remains low, at less than 5 nm per minute at 5 watts per $cm^2$.

The HAMON thesis "Nitridation of vitreous ionic conductors in thin films" defended on 9 Jul. 2004 mentions that the rate of deposition of a Li oxynitride thin film from an $Li_3PO_4$ target is in practice between 1 and 6 nm per min whereas the rates needed to industrialize the method would be at least of the order of 30 nm per min, i.e at least 5 times higher.

This same document further states that the ionic conductivity of thin films is reduced substantially when the deposition rates are increased.

The HAMON thesis lastly stresses the lack of consistency in the mechanical properties of thin films obtained from one sample to the next.

DISCLOSURE OF THE INVENTION

The problem that the invention sets out to resolve is therefore that of developing a target that can be used to industrialize the method of depositing metal oxynitride thin films by ion sputtering at a deposition rate above 30 nm per min while obtaining maximum conductivity for a given material and improved mechanical properties for the thin film obtained.

To do this, the Applicant has perfected a new cathode sputtering metal oxynitride target comprising:
 between 30 and 40 atomic % of a metal, particularly lithium;
 between 2 and 10 atomic % of nitrogen;
 between 35 and 50 atomic % of oxygen,
 the remainder up to 100% being constituted by at least one element selected from the group that comprises phosphorous (P), boron (B), silicon (Si), germanium (Ge), gallium (Ga), sulphur (S) and aluminium (Al).

For an atomic lithium concentration [Li]<30%, the ionic conductivity of thin films is too low. For an atomic lithium concentration [Li]>40%, thin films frequently have growth defects that render them unsuitable for use as an electrolyte, particularly at a deposition rate in excess of 1 μm per hour.

Likewise, for an atomic nitrogen concentration [N]<2%, the ionic conductivity of the thin films obtained is too low for work at deposition rates in excess of 1 μm per hour. For an atomic nitrogen concentration [N]>10%, the state of stress of the thin films obtained is too high for work at deposition rates in excess of 1 μm per hour.

Lastly, for an atomic oxygen concentration [O]<35%, either the electrochemical stability, or the ionic conductivity of the thin films obtained, is too low. For an atomic oxygen concentration [O]>50% the ionic conductivity of the thin films obtained is too low.

In one advantageous embodiment, the total atomic concentration in the target of the element or elements selected from the group comprising phosphorous (P), boron (B), silicon (Si), germanium (Ge), gallium (Ga), sulphur (S) and aluminium (Al) is between 10% and 25%., and to advantage between 12% and 20%.

To advantage, the target further contains phosphorous and/or boron and/or silicon.

In a preferred embodiment, the atomic lithium concentration is between 33% and 38%, the atomic nitrogen concentration is between 4% and 8% while the atomic oxygen concentration is between 40 and 45%.

The target may contain impurities that may either come from the start components used in the manufacture thereof, or be incorporated at the time of said manufacture. In practice, the impurities represent less than 2% molar of the target. At said rate, no substantial alteration is observed in the properties of the materials obtained.

In practice, the target may come in the form of a homogeneous glass or be formed of homogeneous grains or grains of a different type evenly distributed in the target.

The preferred inventive targets have the following chemical formulae: $Li_3P_1O_{3,1}N_{0.6}$; $Li_{2.5}P_{0.5}Si_{0.5}O_{2.6}N_{0.6}$; $(Li_3PO_4)_{0.6}(B_2O_3)_{0.2}(Li_3N)_{0.3}$.

A further object of the invention is a method of manufacturing a metal-oxynitride-based thin film by the magneticfield-assisted cathode sputtering in reactive oxidizing atmosphere of a target, as previously described.

According to another feature of the method, the reactive atmosphere may be constituted by a gas such as pure nitrogen or a mixture of gases, and particularly a nitrogen/argon mixture.

According to another feature, the sputtering is carried out at a power density of between 0.5 W/cm$^2$ and 5 W/cm$^2$.

A further object of the invention is an electrochemical device such as for example a micro-battery, an electrochromic device or a micro super capacitor comprising an electrolyte in the form of a thin film obtained using the method previously described.

The invention and the resulting advantages thereof will become clearer from the embodiment examples given hereinafter.

DETAILED DESCRIPTION OF THE INVENTION

All the examples relate to targets that respect the chemical formula $Li_XAO_YN_Z$, A being composed of at least one of the elements P, Si, B with $[A]=[P]+[Si]+[B]$. The values x, y and z represent the atomic concentrations of Li, O and N.

The targets in examples 1a, 2a and 3a are in accordance with the inventive targets. The targets in examples 1b, 2b and 3b, and 6 are examples showing prior art targets and targets 4 and 5 non-conforming targets.

The formulae of the different targets tested are reproduced in the table below:

| | Atomic Concentration | | | |
|---|---|---|---|---|
| | 30% ≤ [Li] ≤ 40% | 2% ≤ [N] ≤ 10% | 40% ≤ [O] ≤ 50% | 10% < [A] < 25% |
| Example 1a in conformity Target $Li_3P_1O_{3.1}N_{0.6}$ | 39% | 8% | 40% | 13% |
| Example 1b non-conforming Target $Li_3PO_4$ | 38% | 0% | 50% | 13% |
| Example 2a in conformity Target $Li_{2.5}P_{0.5}Si_{0.5}O_{2.6}N_{0.6}$ | 37% | 7% | 40% | 14% |
| Example 2b non-conforming $Li_{2.5}P_{0.5}Si_{0.5}O_{3.5}$ | 36% | 0% | 50% | 14% |
| Example 3° in conformity, target $(Li_3PO_4)_{0.6}(B_2O_3)_{0.2}(Li_3N)_{0.3}$ | 39% | 4% | 43% | 15% |
| Example 3b non-conforming, target $(Li_3PO_4)_{0.6}(LiBO_2)_{0.4}$ | 34% | 0% | 50% | 15% |
| Example 4 non-conforming Target $Li_{2.2}P_1O_{2.4}N_{0.8}$ | 34% | 13% | 38% | 16% |
| Example 5 non-conforming Target $Li_1P_1O_{2.4}N_{0.4}$ | 21% | 8% | 50% | 21% |
| Example 6 non-conforming Target $Li_3PO_4 + Li_3N$ | 50% | 8% | 33% | 8% |

EXAMPLE 1a

A sputtering target of homogeneous composition $Li_3P_1O_{3.1}N_{0.6}$ in conformity with the invention is sputtered by high-frequency magnetron cathode sputtering of a 50/50 Argon/Nitrogen gaseous mixture at 0.8 Pa of pressure at a power density of 4 W/cm$^2$ and with a distance of 10 cm from target to substrates. A deposition rate of 4 μm per hour is obtained for a vitreous thin film of homogeneous appearance with the composition $Li_{2.8}P_1O_3N_{0.6}$ whereof the lithium ion conductivity at ambient temperature is 2.5 E-6 Scm$^{-1}$. A 1.5 μm thick film of this electrolyte is perfectly satisfactory for its insertion into a lithium micro-battery

EXAMPLE 1b

A sputtering target of homogeneous composition $Li_3PO_4$, not in conformity with the invention, is sputtered by high frequency magnetron cathode sputtering of pure nitrogen at 0.8 Pa of pressure at a power density of 4 W/cm$^2$ and with a distance of 10 cm from target to substrates. A deposition rate of 3 μm per hour is obtained for a thin film that is vitreous over a part of its surface and of matt appearance in places. The thin film has a composition $Li_{2.6}P_1O_{3.6}N_{0.1}$ and its lithium ion conductivity at ambient temperature is 0.3 E-6 Scm$^{-1}$. The areas where the thin film is of matt appearance appear granulated under the microscope, and are totally unusable as an electrolyte. The conductivity obtained at this power density starting from such a target is about three to four times lower that what might be hoped for with this material and on the other hand the growth of the thin film formed under said conditions is not conducive to reliable industrial production since significant areas of the thin film present columnar growth unsuitable for its use as an electrolyte in a micro-battery, an electrochromic device or a super capacitor.

EXAMPLE 2a

A sputtering target of homogeneous composition $Li_{2.5}P_{0.5}Si_{0.5}O_{2.7}N_{0.5}$ in conformity with the invention is sputtered by high frequency magnetron sputtering of a 50/50 argon/nitrogen mixture at 0.6 Pa of pressure at a power of 3.5 W/cm$^2$ and with a distance of 10 cm from target to substrates. The deposition rate obtained is 3 μm per hour and a vitreous thin film is obtained of homogeneous appearance and of composition $Li_{2.4}P_{0.5}Si_{0.5}O_{2.2}N_{0.8}$ with lithium ion conductivity at ambient temperature of 12 E-6 Scm$^{-1}$. A 1.5 μm thick film of this electrolyte is perfectly satisfactory for its insertion into a micro-battery.

EXAMPLE 2b

A sputtering target of homogeneous composition $Li_{2.5}P_{0.5}Si_{0.5}O_{3.5}$ not in conformity with the invention is sputtered by high frequency magnetron sputtering of a 50/50 argon/nitrogen mixture at 0.6 Pa of pressure and at a power of 3.5 W/cm$^2$ with a distance of 10 cm from target to substrates. The deposition rate obtained is 2.5 μm per hour and a vitreous matrix thin film is obtained that comprises small grains included in the film. The average composition of the thin film is $Li_{2.4}P_{0.5}Si_{0.5}O_{3.3}N_{0.1}$ and its lithium ion conductivity at ambient temperature is 2 E-7 Scm$^{-1}$.

This thin film can be used as an electrolyte for micro-batteries, but its conductivity is low for this type of material and the growth of the film shows what could be a phase separation which may well compromise the industrialization thereof

EXAMPLE 3a

A target of molar composition $(Li_3PO_4)_{0.6}(B_2O_3)_{0.2}(Li_3N)_{0.3}$ obtained by the homogeneous clustering, via a binding agent, of three powders: $Li_3PO_4$; $B_2O_3$; $Li_3N$. The chemical composition of the target is in accordance with the invention. The target is sputtered by high frequency magnetron cathode sputtering of nitrogen at 0.8 Pa and at a power density of 2 W/cm$^2$ with a distance of 10 cm from target to substrates. A deposition rate of 2 μm per hour is obtained for a vitreous thin film with the composition $Li_{2.5}P_{0.6}B_{0.3}O_{2.5}N_{0.5}$ whereof the lithium ion conductivity at ambient temperature is 1.2 E-6 $Scm^{-1}$. A 1.5 μm thick film of this electrolyte is perfectly satisfactory for its insertion into a micro-battery.

EXAMPLE 3b

A target of molar composition $(Li_3PO_4)_{0.6}(LiBO_2)_{0.4}$ not in conformity with the invention obtained by homogeneous clustering of the two powders: $Li_3PO_4$; $LiBO_2$ is sputtered by high frequency magnetron cathode sputtering of nitrogen at 0.8 Pa at a power density of 2 W/cm² and with a distance of 10 cm from target to substrates. A deposition rate of 1.6 μm per hour is obtained for a vitreous thin film with the composition $Li_{2.2}P_{0.6}B_{0.3}O_{2.9}N_{0.1}$ whereof the lithium ion conductivity at ambient temperature is 4 E-7 $Scm^{-1}$. As has been seen in examples 1a and 3a, there is hope, with this type of material, of obtaining thin films with ionic conductivity at ambient temperature about four times better.

EXAMPLE 4

A target of composition $Li_{2.2}P_1O_{2.4}N_{0.8}$ not in conformity with the invention is sputtered by high frequency magnetron cathode sputtering of nitrogen at 0.8 Pa and at a power density of 2 W/cm² with a distance of 10 cm from target to substrates. A deposition rate of 2.6 μm per hour is obtained for a vitreous thin film with composition $Li_{2.2}P_1O_{2.3}N_{0.9}$ whereof the lithium ion conductivity at ambient temperature is 1 E-7 $Scm^{-1}$. The thin film obtained has a high state of tensile stress when it is deposited on a substrate of sodocalcic white glass and local delamination can even be observed in the thin film with observation under the microscope thereof confirming its state of tension.

An electrochemical stability test on the thin film shows us an initial deterioration thereof when polarization is applied to it in excess of 4 Volts. By way of comparison, a good material of the same family of composition $Li_{2.8}P_1O_3N_{0.6}$ withstands more than 5V and has no high state of stress. A high deposition rate is actually obtained with this target, but properties compatible with an industrialization of the thin films produced are not obtained.

EXAMPLE 5

A sputtering target of non-conforming homogeneous composition $Li_1P_1O_{2.4}N_{0.4}$ is sputtered by high frequency magnetron cathode sputtering of a 50/50 Argon/Nitrogen gaseous mixture at 0.8 P of pressure and at a power density of 2 W/cm² with a distance of 10 cm from target to substrates. A deposition rate of 2 μm per hour is obtained for a vitreous thin film of homogeneous appearance with the composition $Li_1P_1O_{2.3}N_{0.4}$ whereof the lithium ion conductivity at ambient temperature is 1E-8 $Scm^{-1}$. A 1.5 μm thick film of this electrolyte can be used for its insertion into a micro-battery for example, but its conductivity is too far from the current standards obtained in example 1a to aspire to the industrialization thereof.

The invention claimed is:
1. A cathode sputtering target comprising one of the following formulae:
$Li_3P_1O_{3.1}N_{0.6}$
$Li_{2.5}P_{0.5}Si_{0.5}O_{2.6}N_{0.6}$
$(Li_3PO_4)_{0.6}(B_2O_3)_{0.2}(Li_3N)_{0.3}$.

* * * * *